(12) United States Patent
Lee et al.

(10) Patent No.: US 7,095,299 B2
(45) Date of Patent: Aug. 22, 2006

(54) FABRICATION METHOD OF MULTIPLE BAND SURFACE ACOUSTIC WAVE DEVICES

(75) Inventors: Jeong Yub Lee, Seoul (KR); Jang Ho Park, Kyungki-do (KR)

(73) Assignee: Samsung Electro-Mechanics Co., Ltd., Kyungki-Do (KR)

( * ) Notice: Subject to any disclaimer, the term of this patent is extended or adjusted under 35 U.S.C. 154(b) by 82 days.

(21) Appl. No.: 10/854,332

(22) Filed: May 27, 2004

(65) Prior Publication Data

US 2005/0174200 A1    Aug. 11, 2005

(30) Foreign Application Priority Data

Feb. 6, 2004   (KR)   ...................... 10-2004-0007766

(51) Int. Cl.
*H03H 3/08* (2006.01)
*H03H 9/64* (2006.01)

(52) U.S. Cl. ..................................... 333/193; 29/25.35

(58) Field of Classification Search ................ 333/193, 333/133

See application file for complete search history.

(56) References Cited

U.S. PATENT DOCUMENTS 5,591,480 A * 1/1997 Weisman et al. ............. 216/13

6,377,138 B1 * 4/2002 Takagi et al. ................ 333/193

FOREIGN PATENT DOCUMENTS

| JP | 10-93369 | * | 4/1998 |
| JP | 10-190390 | | 7/1998 |
| JP | 2002-319834 | * | 10/2002 |

* cited by examiner

*Primary Examiner*—Barbara Summons
(74) *Attorney, Agent, or Firm*—Lowe Hauptman & Berner, LLP

(57) ABSTRACT

In a fabrication method of a SAW device, a first conductive layer, an etch-stop layer made of conductive material and a second conductive layer are formed one atop another in order on a piezoelectric ceramic substrate. A mask is provided on a first portion of the second conductive layer corresponding to a first SAW filter. A second portion of the second conductive layer corresponding to a second SAW filter is selectively removed using the mask. The mask is removed and a photoresist pattern used for forming electrodes of the SAW filters is provided on the first portion of the second conductive layer corresponding to the first SAW filter region and on a first portion of the etch-stop layer corresponding to the second SAW filter region. The first and second conductive layers and the etch-stop layer are selectively removed using the photoresist pattern, and the photoresist pattern is then removed.

6 Claims, 3 Drawing Sheets

FABRICATION METHOD OF MULTIPLE BAND SURFACE ACOUSTIC WAVE DEVICES

BACKGROUND OF THE INVENTION

1. Field of the Invention

The present invention relates to a fabrication method of Surface Acoustic Wave (SAW) devices, more particularly, which can fabricate a multi-band SAW device having electrodes of different thickness formed on a single substrate.

2. Description of the Related Art

At the present, SAW devices are fabricated as a device that has at least two SAW filers formed on a single substrate in order to obtain dual band or multi-band filter characteristics. A multi-band SAW device necessarily has electrodes of different mass (which is referred to as mass-loading effect) in order to have filtering ability in various frequency bands. For the purpose of this, there are schemes of providing electrodes of different thickness for various frequency bands.

As a conventional approach, Japanese Patent Publication No. 10-190390, filed on Dec. 25, 1996, Murata Mfg. Co. Ltd., discloses a SAW device fabrication method which forms electrodes of different thickness on a single substrate via photolithography and etching. FIGS. 1A to 1E are stepwise sectional views illustrating a fabrication method of SAW devices for dual band filters disclosed in this document.

According to the above document, as shown in FIG. 1A, a conductive layer 2 which is to form itself into a first electrode of a first SAW filter is deposited on a piezoelectric ceramic substrate 1, and a photoresist pattern 5 in use for forming the first electrode is provided on the conductive layer 2 of the first SAW filter. Exposed portions of the conductive layer 2 is selectively removed with etchant, as shown in FIG. 1B, to provide the first electrode 2a of the first SAW filter 10a on a first region of the piezoelectric ceramic substrate 1. Next, a photoresist pattern 6 in use for forming a second electrode of a second SAW filter is provided on the piezoelectric ceramic substrate 1 as shown in FIG. 1C, and a conductive layer 4 of a thickness corresponding to the second electrode is deposited on the resultant structure as shown in FIG. 1D. Then, a portion 4b of the conductive layer 4 is lifted off along with the photoresist pattern 6 to provide the second electrode 4a of the second SAW filter 10b on a second region of the piezoelectric ceramic substrate 1.

On this wise, Japanese Patent Publication No. 10-190390 forms the first and second SAW filter electrodes 2a and 4a of different thickness on the same piezoelectric ceramic substrate 1 via photolithography and etching to produce a SAW device 10 as a dual band filter.

However, this fabrication method may bring undesirable problems owing to photlithography and lift-off procedures. First of all, the photoresist patterning step can rarely produce a clean side profile in the pattern owing to restrictions of conventional photolithography. This problem degrades the side profile of the photoresist pattern, and thus gives as a drawback a more uneven side profile to the second electrode 4a obtained through the lift-off procedure than the side of the first electrode 2a obtained through the step of FIG. 1B, thereby deteriorating the characteristics of the second SAW filter 10b.

Furthermore, there is a problem in that the electrodes become highly corrodible because they are exposed to a high humidity environment of for example stripping solution during the lift-off procedure. In the meantime, a multi-band SAW device requires at least two lift-off procedures in order to produce at least three SAW filters of different electrode thickness. The repeated lift-off procedures worsen the above problems while excessively complicating the entire process.

SUMMARY OF THE INVENTION

The present invention has been made to solve the foregoing problems of the prior art and it is therefore an object of the present invention to provide a fabrication method of SAW devices for forming at least two SAW filters on a single piezoelectric ceramic substrate, more particularly, which produces electrodes of different thickness by using conductive layers which are to form itself into the electrodes and an etch-stop layer of conductive material having a different etching condition from the conductive layers.

According to an aspect of the invention for realizing the object, there is provided a fabrication method of a SAW device having first and second SAW filters of different electrode thickness formed on a single piezoelectric ceramic substrate, the method comprising the following steps of: forming a first conductive layer, an etch-stop layer made of conductive material and a second conductive layer one atop another in their order on the piezoelectric ceramic substrate; forming a mask on a first portion of the second conductive layer corresponding to a first SAW filter region; selectively removing a second portion of the second conductive layer corresponding to a second SAW filter region by using the mask; removing the mask and providing a photoresist pattern in use for forming electrodes of the first and second SAW filters on the first portion of the second conductive layer corresponding to the first SAW filter region and on a first portion of the etch-stop layer corresponding to the second SAW filter region; selectively removing the first and second conductive layers and the etch-stop layer by using the photoresist pattern; and removing the photoresist pattern.

Preferably, the first and second conductive layers are made of a same metal, and the second conductive layer is made of Al, and the etch-stop layer is made of Cr or Mo. Further, the etch stop layer preferably has a thickness of about 5 to 20 nm.

According to another aspect of the invention, the step of removing the second contact layer portion corresponding to the second SAW filter may comprise the step of wet etching the second conductive layer portion with etchant containing phosphoric acid, nitric acid and acetic acid. Alternatively, the step of removing the second conductive layer portion corresponding to the second SAW filter may comprise the step of dry etching the second conductive layer portion with $Cl_2$ gas.

Also, the step of selectively removing the first and second conductive layers and the etch-stop layer may comprises the step of physically removing the etch-stop layer by using Ar gas in a high bias power range. In this case, the step of physically removing the etch-stop layer may comprise the step of lowering the bias power, which is used for removing the etch-stop layer, before the first conductive layer is completely removed, if the etch-stop layer is removed, in order to prevent damage to the surface of the piezoelectric ceramic substrate.

Alternatively, the step of selectively etching the first and second conductive layers and the etch-stop layer may comprise the step of dry etching the first and second conductive layers and the etch-stop layer with $Cl_2$ gas and $O_2$ gas.

According to other aspect of the invention for realizing the object, there is provided a fabrication method of a Surface Acoustic Wave (SAW) device having a plurality of SAW filters of different electrode thickness on a single piezoelectric ceramic substrate, the method comprising the following steps of: forming an electrode structure having a plurality of conductive layers on the piezoelectric ceramic substrate and etch-stop layers each interposed between adjacent ones of the conductive layers; selectively etching regions of the respective SAW filters by using the etch-stop layers to form sub-electrode structures of different thickness in the respective SAW filter regions; providing a photoresist pattern for forming an electrode pattern on the sub-electrode structures in the respective SAW filter regions; and selectively etching the sub-electrode structures by using the photoresist pattern to form electrodes in the respective SAW filter regions.

According to still another aspect of the invention for realizing the object, there is provided a Surface Acoustic Wave (SAW) device having first and second SAW filters of different electrode thickness formed on a single piezoelectric ceramic substrate comprising: a first electrode including a first lower conductive layer, a first etch-stop layer and a first upper conductive layer laid in their order in a first SAW filter region on the piezoelectric ceramic substrate; and a second electrode including a second conductive layer and a second etch-stop layer laid in their order in a second SAW filter region on the piezoelectric ceramic substrate, wherein the first lower conductive layer and the second conductive layer are made of a same material at a same thickness, and the first and second etch-stop layers are made of a same material of a same thickness.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE PREFERRED EMBODIMENT

Preferred embodiments of the present invention will now be described in detail with reference to the accompanying drawings.

FIGS. 2A to 2F are stepwise sectional views illustrating a fabrication method of SAW devices according to the invention, which provides a SAW device having first and second SAW filters of different electrode thickness formed on a single piezoelectric ceramic substrate.

Figure 1:
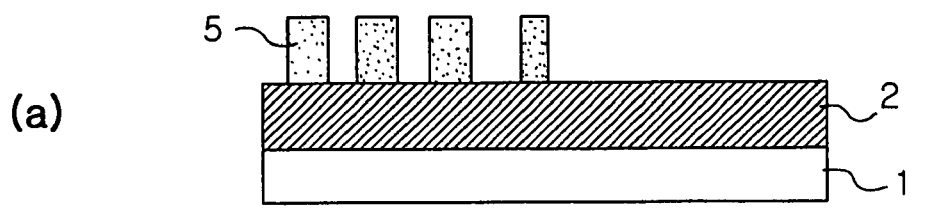
FIGS. 1A to 1E are stepwise sectional views illustrating a conventional fabrication method of SAW devices.
Figure 1:
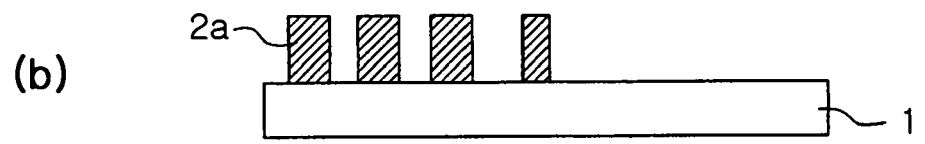
Figure 1:
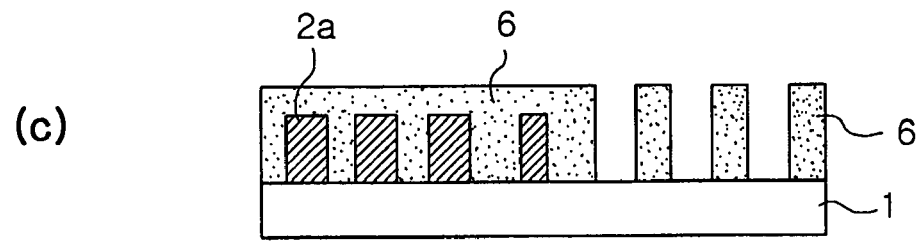
Figure 1:
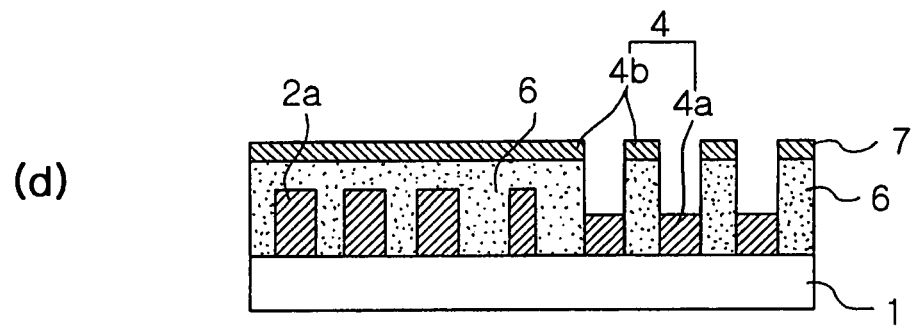
Figure 1:
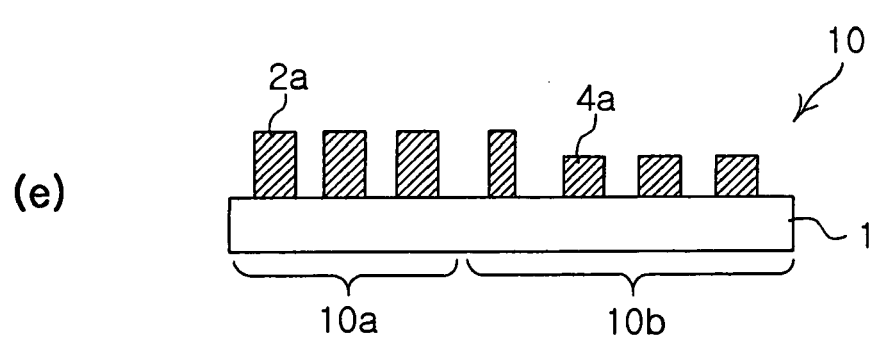
Figure 2:
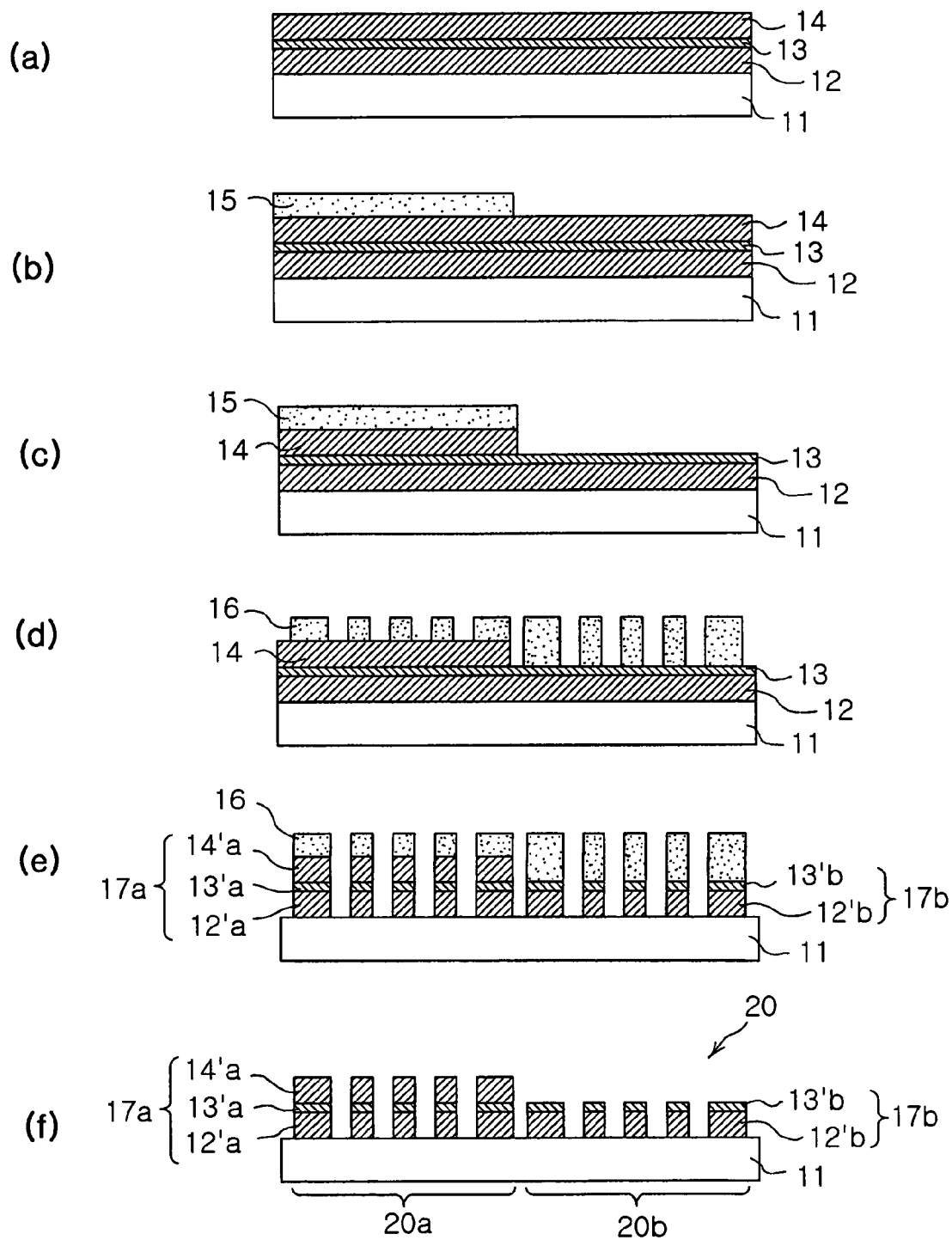
FIGS. 2A to 2F are stepwise sectional views illustrating a fabrication method of SAW devices according to the invention.

First, as shown in FIG. 2A, a first conductive layer 12, an etch-stop layer 13 and a second conductive layer 14 are formed one atop another in their order on a piezoelectric ceramic substrate 11. The piezoelectric ceramic substrate 11 may be made of for example $LiTaO_2$ or $LiNbO_2$, and the etch-stop layer 13 is made of a conductive material with its etching rate showing a great difference at least from that of the first conductive layer 12 according to etching conditions. Preferably, the first conductive layer 12 is made of for example Al that is a typical electrode material for SAW filters, the etch-stop layer 13 is made of for example Cr or Mo. The second conductive layer 14 can be made of for example Al the same as that of the first conductive layer 12. That is, the second conductive layer 14 is determined according to the electrode thickness difference between the first and second SAW filters. The thickness of the first conductive layer 12 and the thickness of the etch-stop layer 13 are determined according to the electrode thickness of the second SAW filter. Considering the influence on a following removal step and electrode characteristics, the etch-stop layer 13 is preferably formed thin in a range of about 5 to 20 nm.

Then, a mask 15 is provided on a portion of the second conductive layer 14 corresponding to a second SAW filter region as shown in FIG. 2B. The mask 15 functions to shield the first SAW filter region, and can be formed by using a photoresist. That is, the mask 15 shown in FIG. 2B can be obtained by means of applying a photoresist on the second conductive layer 14, and then patterning the photoresist, that is, selectively removing a portion of the photoresist from the second SAW filter region via exposure.

Next, as shown in FIG. 2C, the second conductive layer 14 is removed from the second SAW filter region via selective etching. While this step can utilize both wet etching and dry etching, etching conditions such as etchant may be selected to have a high etching rate with respect to the second conductive layer 14 and a low etching rate with respect to the etch-stop layer 13. Therefore, if the second conductive layer 14 is made of Al and the etch-stop layer 13 is made of Cr or Mo, the wet etching preferably utilizes an etchant containing phosphoric acid, nitric acid and acetic acid. The dry etching may adopt Reactive Ion Etching (RIE) or Inductively Coupled Plasma Etching (ICPE), and more particularly, may use those gases such as $Cl_2$ gas reactive to metal such as Al. However, the $Cl_2$ gas etching is preferably performed by applying low bias power in order to substantially prevent the reaction of the etch-stop layer 13 of for example Cr.

Next, the mask 15 is removed, and then as shown in FIG. 2D, a photoresist pattern 16 for forming electrodes of the first and second SAW filters is provided on the residual second conductive layer 14 corresponding to the first SAW filter region and on an exposed portion of the etch-stop layer 13 corresponding to the second SAW filter region. The photoresist 16 may be formed by means of applying a photoresist on the second conductive layer 14 and the exposed etch-stop layer 13 and selectively removing the photoresist via exposure. On this wise, the present invention adopts the photoresist pattern 16 to simultaneously form the two SAW filter electrodes.

Then, the first and second conductive layers 12 and 14 and the etch-stop layer 13 are partially removed via selective etching by using the photoresist pattern 16 as a mask to form electrodes 17a and 17b of first and second SAW filters 20a and 20b as shown in FIG. 2E. Although the etching step may remove the first conductive layer 12, the etch-stop layer 13 and the second conductive layer 14 under different etching conditions, it is preferably performed under etching conditions capable of simultaneously removing the layers 12, 13 and 14 in view of process efficiency. As a consequence, it is preferred that the etching condition is so selected that the etch-stop layer 13 is etched together with the first and second conductive layers 12 and 14.

As a preferable etching condition, $O_2$ gas may be added to $Cl_2$ gas where the etch-stop layer 13 is made of Cr or Mo. In this etching condition, $O_2$ gas improves reactivity between $Cl_2$ gas and Cr or Mo so that the etch-stop layer 13 can be removed together with the first and second conductive layers 12 and 14 of Al.

To the contrary, as a condition for removing the etch-stop layer 13, it is possible to use $Cl_2$ gas at a relatively weak bias power to remove the first and second conductive layers 12 and 14 of Al but Ar gas at a relatively strong bias power to etch the etch-stop layer 13. In this case, there is no chemical reaction between the etch-stop layer 13 and Ar gas, but the relatively thin etch-stop layer 13 can be physically removed under ion bombardment of high energy Ar ions. Considering the characteristics of the SAW device sensitive to surface conditions, it is preferable to lower the strong bias power applied to the etch-stop layer 13 before the first conductive layer 12 is completely removed, if the etch-stop layer 13 is removed, not to damage the surface of the piezoelectric ceramic substrate 11.

Finally, as shown in FIG. 2F, the photoresist pattern 16 is removed from the resultant structure shown in FIG. 2E to form the electrodes 17a and 17b of the first and second SAW filters 20a and 20b at different thickness. On this wise, the fabrication method of SAW devices according to the invention can form two electrodes of different thickness at the same time without using a lift-off procedure. Therefore, the present invention can overcome those problems of the uneven side profile and corrosion of electrodes by strip solution resulting from the lift-off procedure. Furthermore, because the fabrication method of the present invention performs the electrode-forming step only after completing the deposition step of conductive layers which are to form themselves into electrodes, it can simultaneously pattern two electrodes of different thickness from a single photoresist pattern without repeated transport into a process chamber for electrode deposition.

The present invention can be readily applied to a fabrication process of SAW devices having at least three SAW filters of different electrode thickness. That is, this process forms an electrode structure having a plurality of conductive layers on a piezoelectric ceramic substrate and etch-stop layers each interposed between adjacent ones of the conductive layers, and repeats those steps as shown in FIGS. 2C and 2D to selectively etch respective SAW filter regions by using the etch-stop layers, thereby forming sub-electrode structures of different thickness in the respective regions.

Figure 3:
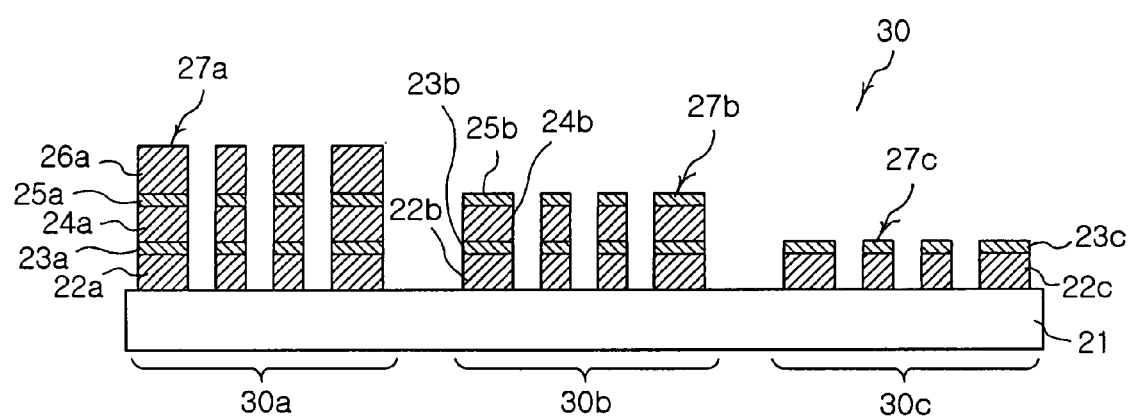
FIG. 3 is a sectional view illustrating a SAW device having three filter regions fabricated according to the invention.

Then, a photoresist pattern for forming an electrode pattern is provided on the sub-electrode structures, which are in turn selectively etched by using the photoresist pattern to form electrodes of respective SAW filters. In this manner, the fabrication process of the invention can produce a SAW device having at least three SAW filters of different electrode thickness. FIG. 3 is a sectional view illustrating a SAW device having three filter regions fabricated according to the invention.

Referring to FIG. 3, the SAW device 30 includes three SAW filter regions 30a, 30b and 30c formed on one piezoelectric ceramic substrate 21. The electrode 27a of the first SAW filter 30a includes lower, intermediate and upper conductive layers 22a, 24a and 26a, lower and upper etch-stop layers 23a and 25a, and the electrode 27b of the second SAW filter 30 includes lower and upper conductive layers 22b and 24b and lower and upper etch-stop layers 23b and 25b. In the meantime, the electrode 27c of the third SAW filter 30c includes a conductive layer 22a and an etch-stop layer 23c. The first SAW filter lower conductive layer 22a, the second SAW filter lower conductive layer 22b and the third SAW filter conductive layer 22c have the same thickness because they are formed from a single conductive layer made of for example Al. The first SAW etch-stop layer 23a, the second SAW filter etch-stop layer 23b and the third SAW etch-stop layer 23c have the same thickness also because they are formed from a single material layer made of for example Cr or Mo. Similarly, the first SAW filter intermediate conductive layer 24a and the second SAW filter upper conductive layer 24b have the same thickness because they are formed from the same conductive layer, and the first SAW filter etch-stop layer 25a and the second SAW filter etch-stop layer 25b have the same thickness because they are formed from the same material layer.

The SAW device 30 shown in FIG. 3 can be fabricated as follows: A first conductive layer, a first etch-stop layer, a second conductive layer, a second etch-stop layer and a third etch-stop layer are formed in their order on a single piezoelectric substrate. Next, a first mask is applied on the third conductive layer corresponding to a first SAW filter region to remove a portion of the third conductive layer corresponding to second and third SAW filter regions by using the first mask. Then, a second mask is applied on the first and second SAW filter regions to partially remove the second etch-stop layer and the second conductive layer. In this case, after the second etch-stop layer is removed first, the second conductive layer is removed under a desirable etching condition of low selectivity to the first etch-stop layer until etching proceeds to the top of the first etch-stop layer.

While the present invention has been described with reference to the particular illustrative embodiments and the accompanying drawings, it is not to be limited thereto but will be defined by the appended claims. It is to be appreciated that those skilled in the art can substitute, change or modify the embodiments into various forms without departing from the scope and spirit of the present invention.

As set forth above, the present invention can form SAW filter electrodes of different thickness by using at least one etch-stop layer without any lift-off procedure to overcome the problem of the uneven side profile of electrodes as well as effectively prevent the corrosion of electrodes by strip solution. Furthermore, because the electrodes are formed only after the deposition of conductive layers which are to form themselves into the electrodes, the present invention can simultaneously pattern the electrodes of different thickness by using one photoresist pattern without repeated transport into a process chamber for electrode deposition, thereby simplifying the process.

What is claimed is:

1. A method of fabricating a Surface Acoustic Wave (SAW) device having first and second SAW filters, which have different electrode thicknesses and are formed on a single piezoelectric ceramic substrate, the method comprising the steps of:

forming a first conductive layer, an etch-stop layer made of conductive material and a second conductive layer one atop another in the recited order on the piezoelectric ceramic substrate;

forming a mask on a first portion of the second conductive layer corresponding to a first SAW filter region;

selectively removing a second portion of the second conductive layer corresponding to a second SAW filter region by using the mask;

removing the mask and providing a photoresist pattern for forming electrodes of the first and second SAW filters, wherein the photoresist pattern is provided on the first portion of the second conductive layer corresponding to the first SAW filter region and on a portion of the etch-stop layer corresponding to the second SAW filter region;

selectively removing the first and second conductive layers and the etch-stop layer by using the photoresist pattern as a mask; and removing the photoresist pattern;

wherein the step of selectively removing the first and second conductive layers and the etch-stop layer comprises physically removing the etch-stop layer by using Ar gas in a high bias power range; and the step of physically removing the etch-stop layer comprises lowering the bias power, which is used for removing the etch-stop layer, before the first conductive layer is completely removed and after the etch-stop layer has been removed.

2. The fabrication method according to claim 1, wherein the first and second conductive layers are made of the same metal.

3. The fabrication method according to claim 1, wherein the second conductive layer is made of Al, and the etch-stop layer is made of Cr or Mo.

4. The fabrication method of according to claim 1, wherein the etch stop layer has a thickness of about 5 to 20 nm.

5. The fabrication method according to claim 1, wherein the step of selectively removing the second portion of the second conductive layer comprises wet etching the second portion of the second conductive layer with an etchant containing phosphoric acid, nitric acid and acetic acid.

6. The fabrication method according to claim 1, wherein the step of selectively removing the second portion of the second conductive layer comprises dry etching the second portion of the second conductive layer with $Cl_2$ gas.

* * * * *